(12) United States Patent
Hocking et al.

(10) Patent No.: US 11,634,317 B2
(45) Date of Patent: Apr. 25, 2023

(54) COMPOSITE SPRING FOR ROBUST PIEZOELECTRIC SENSING

(71) Applicant: Kionix, Inc., Ithaca, NY (US)

(72) Inventors: Andrew Hocking, Ithaca, NY (US); Martin Heller, Ithaca, NY (US); Wenting Gu, Ithaca, NY (US)

(73) Assignee: Kionix, Inc., Ithaca, NY (US)

( * ) Notice: Subject to any disclaimer, the term of this patent is extended or adjusted under 35 U.S.C. 154(b) by 886 days.

(21) Appl. No.: 16/392,224

(22) Filed: Apr. 23, 2019

(65) Prior Publication Data

US 2019/0322522 A1 Oct. 24, 2019

Related U.S. Application Data

(60) Provisional application No. 62/662,155, filed on Apr. 24, 2018.

(51) Int. Cl.
*B81B 3/00* (2006.01)
*H01L 41/113* (2006.01)
*B81C 1/00* (2006.01)
*H01L 41/187* (2006.01)

(52) U.S. Cl.
CPC ........ *B81B 3/0086* (2013.01); *B81C 1/00698* (2013.01); *H01L 41/1132* (2013.01); *H01L 41/187* (2013.01); *B81B 2203/0118* (2013.01)

(58) Field of Classification Search
CPC ........... B81B 3/0086; B81B 2203/0118; B81B 2201/025; B81B 2203/0163; B81B 3/00; B81C 1/00698; H01L 41/1132; H01L 41/187; H01L 41/1136; G09G 5/00; G09G 5/08; G06F 3/033; G06F 3/02
See application file for complete search history.

(56) References Cited

U.S. PATENT DOCUMENTS

| | | | | |
|---|---|---|---|---|
| 2009/0243005 | A1* | 10/2009 | Yokoyama | ......... B81C 1/00182 257/415 |
| 2011/0239440 | A1* | 10/2011 | Starzynski | ............ G01P 15/097 29/592.1 |
| 2012/0248931 | A1* | 10/2012 | Reinmuth | ............. G01L 9/0005 310/300 |
| 2019/0214542 | A1* | 7/2019 | Yoshida | .................... G01L 1/16 |

* cited by examiner

*Primary Examiner* — Pegeman Karimi
(74) *Attorney, Agent, or Firm* — Weaver Austin Villeneuve & Sampson LLP

(57) ABSTRACT

A micro-electromechanical system (MEMS) device comprises a fixed portion and a proofmass suspended by at least one composite beam. The composite beam is cantilevered relative to the fixed portion and extends between a first end that is integrally formed with the fixed portion and a second distal end. The composite beam comprises an insulator having a top surface and at least two side surfaces; a conductor extending away from the fixed portion and surrounding at least a portion of the insulator; and a second conductor positioned adjacent to the top surface of the conductor and extending parallel with the insulator away from the fixed portion. The second conductor is separated from the first conductor to provide a low parasitic conductance of the composite beam.

16 Claims, 4 Drawing Sheets

COMPOSITE SPRING FOR ROBUST PIEZOELECTRIC SENSING

CROSS-REFERENCE TO RELATED APPLICATIONS

This patent application claims priority from Provisional Application Ser. No. 62/662,155 filed Apr. 24, 2018, which is incorporated herein by reference in its entirety.

FIELD OF THE INVENTION

The present application relates to Micro Electro-Mechanical Systems (MEMS), and more particularly to using piezoelectric sensing in such systems.

BACKGROUND

Micro Electro-Mechanical Systems (MEMS), such as motion sensors, inertial sensors, and movable mirrors, are being widely used. As is well known, a MEMS motion sensor may be, for example, an accelerometer for detecting linear motion, or a gyroscope for detecting rotation and angular velocities.

Advanced planar silicon manufacturing processes have become the main manufacturing techniques in MEMS. Direct bonding of double or triple silicon wafers has been recognized as the most attractive packaging technology. However, integrated and robust wafer bonding involving multiple wafers in manufacturing a MEMS device remains a challenge.

BRIEF SUMMARY

Various embodiments are directed to a micro-electromechanical system (MEMS) device comprising: a fixed portion; a first beam cantilevered relative to the fixed portion, wherein the first beam comprises: an insulator having a top surface and at least two side surfaces, wherein the insulator extends away from the fixed portion; a conductor extending away from the fixed portion and surrounding at least a portion of the insulator; and a second conductor positioned adjacent to the top surface of the conductor and extending parallel with the insulator away from the fixed portion.

In certain embodiments, the insulator comprises oxide. In various embodiments, the conductor comprises silicon. In certain embodiments, the second conductor comprises a metallic material. Moreover, the MEMS device may further comprise a piezoelectric material disposed on a top surface of the second conductor. In certain embodiments, the piezoelectric material comprises at least one of: AlN or ScAlN. In various embodiments, the MEMS device further comprises at least one insulator cap positioned between the insulator and the second conductor. In various embodiments, the conductor extends along a length of the first beam, adjacent the at least two side surfaces of the insulator. Moreover, the insulator may have a first height, measured parallel to the at least two side surfaces and perpendicular to the top surface; and the conductor may have a second height, measured parallel to the first height, and wherein the second height may be at least substantially equal to the first height. In certain embodiments, the first height is between about 5-12 µm. Moreover, the insulator may have a width, measured between two side surfaces of about 50 µm. In certain embodiments, the conductor has a thickness, measured parallel to the width of the insulator, of about 5 µm. In various embodiments, the MEMS device further comprises a proof mass suspended relative to the fixed portion; and a first conducting flexlead extending from a distal end of the first beam, opposite the fixed portion, and connecting the proof mass with the first beam. In various embodiments, the first conducting flexlead is integrally formed with the conductor. Moreover, the first conducting flexlead and the conductor may comprise silicon. In certain embodiments, the MEMS device further comprises a second beam cantilevered relative to the fixed portion; and a second flexlead extending from a distal end of the second beam, opposite the fixed portion, and connecting the proof mass with the second beam.

BRIEF DESCRIPTION OF THE DRAWINGS

Reference will now be made to the accompanying drawings, which are not necessarily drawn to scale, and wherein.

DETAILED DESCRIPTION

The present disclosure describes in detail various embodiments of a MEMS device with reference to the accompanying drawings. It should be understood that some, but not all embodiments are shown and described herein. The embodiments may take many different forms, and accordingly this disclosure should not be construed as limited to the embodiments set forth herein. Rather, these embodiments are provided so that this disclosure will satisfy applicable legal requirements. Like numbers refer to like elements throughout.

Embodiments of the present invention reduce the parasitic capacitance of a MEMS device, specifically in achieving a relatively quick power wake-up, by including a piezoelectric sensor in the MEMS device.

Figure 1:
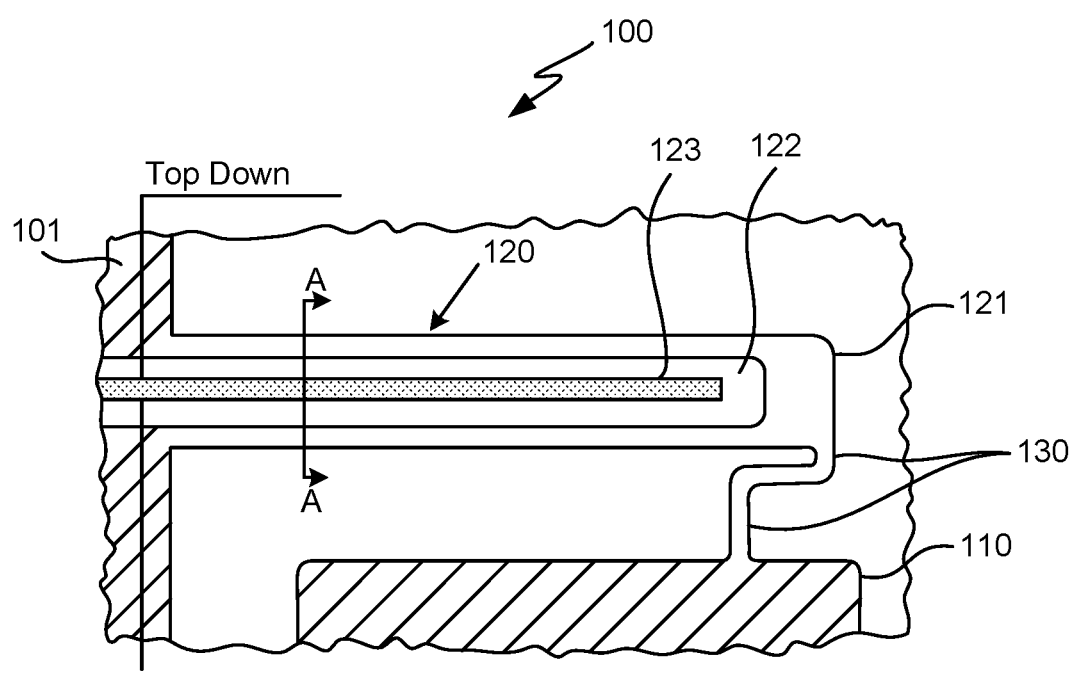
FIG. 1 is a schematic, top view of a composite spring and associated flexlead according to one embodiment.

FIG. 1 is a simplified top schematic view of a portion of a MEMS device 100, in accordance with one embodiment of the present invention. MEMS device 100 is shown as including a composite beam spring 120 comprising both insulating material (e.g., oxide, such as insulator 122) and one or more conductors (e.g., first conductor 121 and/or second conductor 123) that collectively mechanically couple a fixed portion 101 (e.g., comprising a handle wafer portion and/or device wafer) with a proofmass 110. The composite beam 120 defines a first end that is anchored to the fixed portion 101, and a second, distal end that is connected with the proofmass 110. In certain embodiments, the second end of a composite beam 120 may be directly anchored with the proofmass 110, and in such embodiments the composite beam 120 defines a flexible link between the fixed portion 101 and the proofmass 110. In other embodiments (such as that shown in the top view of FIG. 1), the second, distal end of the composite beam 110 may be a free end, and a conductive flexlead 130 mechanically connects the composite beam 120 with the proofmass 110 as illustrated in FIG. 1. Such a configuration enables the proofmass 110 to move (e.g., vertically) relative to the fixed portion 101. For example, the proofmass 110 may be enabled to move between over-range stops (not shown) that collectively define a total proofmass travel distance (e.g., between an upper over-range stop and a lower over-range stop). As the proofmass 110 moves, for example, upon the application of an external force to the MEMS device 100, the flexlead 130 and the composite beam spring 120 deform, which places internal tensile and compressive stresses within both the flexlead 130 and the composite beam spring 120. Due to the presence of flexible conductor material within the flexlead 130 and the composite beam spring 120, the overall force applied to the relatively brittle insulator (e.g., oxide) is reduced, thereby increasing the overall durability of the MEMS device 100.

Moreover, the proofmass 110 (e.g., embodied by one or more electronic components disposed on the proofmass 110) may be in electrical connection with the fixed portion 101 via the one or more conductors which may be embodied as a portion of the composite beam 120 and/or as the flexlead 130. In the illustrated embodiment, the fixed portion 101 and the proofmass 110 each comprise a silicon base, and may be coated with oxide.

As discussed in greater detail herein, the composite beam 120 may comprise an insulator (e.g., an oxide) having a conductor (e.g., silicon) at least partially surrounding the insulator. For example, the conductor may comprise silicon conductors present within the same, first plane as the oxide, and having a second (e.g., metallic) conductor located within a second plane parallel with the first plane. In other words, the conductor comprising the first conductor may extend along opposite, parallel first and second sides of the oxide and may have a height at least substantially equal to the height of the insulator, and the second conductor may be located on another, third side (e.g., a top side) of the insulator that is perpendicular to both the first and second sides. Moreover, a top side of the composite beam may have a piezoelectric material coating (e.g., ScAlN) in contact with the second conductor.

As discussed herein, certain embodiments comprise a flexlead 130 configured for electrically and mechanically coupling a distal end of the composite beam 120 with the proofmass 110. The flexlead 130 comprises a conducting material, such as a silicon material in electrical connection with (e.g., integrally formed with) conductors (e.g., the conductor 123) of the composite beam 120 and the proofmass 110. The flexlead 130 may be defined as a thin beam defining a tortuous path enabling elongation of the flexlead 130 during deformation (bending) of the composite beam 120 and displacement of the proofmass 110. The thin beam of the flexlead 130 may have a rectangular cross-sectional profile, defined by etching and deposit methodologies known in the art. The thin beam of the flexlead 130 may have a height corresponding to the height of the conductor within the composite beam 120 (e.g., the conductor 121). In a specific example, the height of the flexlead 130 is at least substantially the same as the height of the conductor (e.g., conductor 121) within the composite beam 120 (and the height of the insulator 122 of the composite beam 120). In certain embodiments, the height of the composite beam 120 and the height of the flexlead 130 may be substantially smaller than the height of the fixed portion 101 and/or the height of the proofmass 110.

Moreover, in certain embodiments, the flexlead 130 of certain embodiments may comprise two thin beams extending between the composite beam 120 and the proofmass 110. The two thin beams may have corresponding shapes and/or sizes, such as tortuous paths having identical or mirrored shapes.

In another example implementation, the composite beam 120 extends from a first end that is integrally formed with a fixed portion 101 to a second, distal end that is integrally formed with a proofmass 110. Moreover, the composite beam 120 of such embodiments has a height that is significantly less than the fixed portion 101 or the proofmass 110, such that the composite beam 120 is configured to flex upon the application of an external force to the MEMS device 100.

In accordance with one aspect, embodiments of the present invention provide a composite beam 120 of a first conductor (e.g., a conductor 121) and insulator (e.g., insulator 122), in which both the conductor 121 and the insulator 122 are in the same plane, and a second conductor 123 is disposed on top of the insulator 122 (in a second plane parallel with the first plane), so as to minimize the parasitic capacitance between the second conductor 123 and first conductor of the conductor 121. FIG. 1 illustrates a schematic top view of such a composite beam 120 in accordance with one embodiment. As shown in FIG. 1, a first end of the composite beam 120 may be anchored to the fixed portion 101 and extends to a distal second end. Accordingly, the composite beam 120 is cantilevered from the fixed portion 101. A flexlead 130 extends from the second end to the proofmass 110 thereby mechanically and flexibly securing the proofmass 110 with the composite beam 120. As discussed herein, the flexlead 130 may be integrally formed with the first conductor (e.g., the conductor 121) of the composite beam 120 (and a conductor of the proofmass 110). The flexlead 130 may define a tortuous path between the edge of the composite beam 120 and the proofmass 110, including one or more corners, bends, and/or the like. In certain embodiments, the entirety of the flexlead's tortuous path may be coplanar with the first conductor (e.g., conductor 121) of the composite beam 120. In such embodiments, the flexlead 130 is configured to effectively elongate (e.g., by deforming corners of the tortuous path to elastically straighten) as the distance between the proofmass 110 and the second, distal end of the composite beam 120 changes when the proofmass 110 is displaced vertically (e.g., while a force is applied to the MEMS device 100). For clarity, the flexlead 130 (and the composite beam 120) may be configured for elastic deformation, such as to return the proofmass 110 to a neutral position once the external force is removed from the MEMS device 100.

Figure 2A:
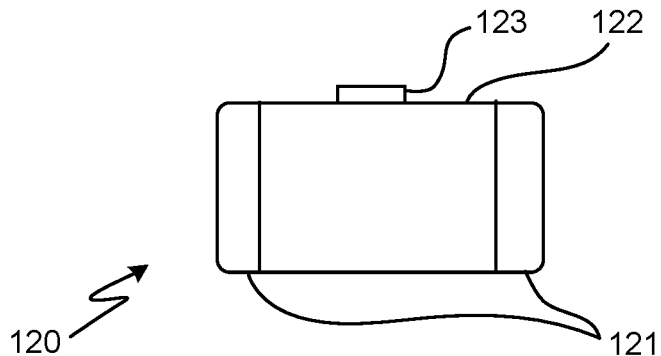
FIGS. 2A-2B are alternative, example cross-sectional views of the composite spring shown in FIG. 1, taken along plane A-A.
Figure 2B:
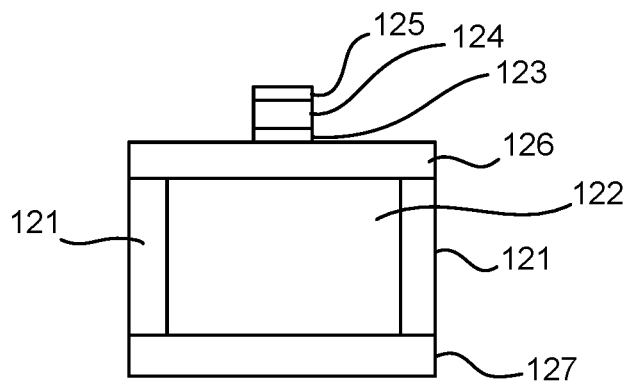
Figure 3:
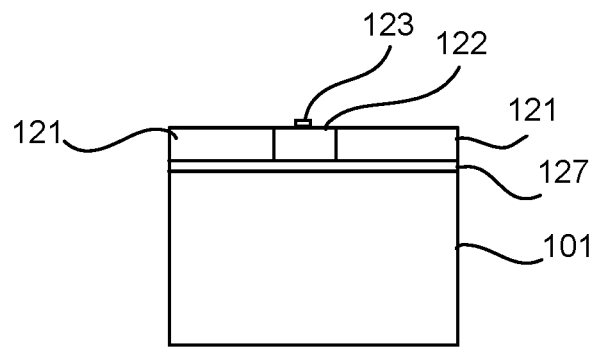
FIG. 3 is an example cross-sectional view of the fixed portion connected to the composite spring shown in FIG. 1, taken along plane B-B.

As illustrated in FIG. 1, as well as the cross-sectional views of FIGS. 2A-2B and FIG. 3, the composite beam 120 comprises a first conductor 121, an insulator 122, and a second conductor 123. In various embodiments, the first conductor 121 comprises silicon, the insulator 122 comprises oxide, and the second conductor 123 comprises a metal. As discussed in greater detail herein, the first conductor may be integrally formed with conductors of the proofmass 110, the flexlead 130, and the fixed portion 101. Moreover, the insulator 122 may be defined as an elongated insulator beam (e.g., having an at least substantially rectangular profile) that extends along substantially the entire length of the composite beam 120 between a solid conductor distal end and the formed first end, which is integrally formed with the fixed portion 101. The insulator may extend beyond the first end of the composite beam 120 and into the fixed portion 101 as shown in FIG. 1.

As illustrated in the cross-sectional view of FIG. 2B, which constitutes an alternative cross-sectional view of FIG.

2A, a piezoelectric material 124 may be disposed on the second conductive material 123. Moreover, the composite beam 120 may comprise an additional insulator layer 126 above the insulator 122 and first conductor 121 (e.g., between the insulator 122 and the second conductor 123), and an additional insulator layer 127 below the insulator 122 and first conductor 121. A top electrode 125 may be disposed above the piezoelectric material 124.

One advantage of using a composite beam 120 comprising a conductor and insulator instead of just an insulator is that the conductor, such as silicon, can allow for much higher stresses without breakage in a shock event. This enables the conductor flexlead 130 to be integrally formed with a part of the composite beam 120 to connect the composite beam 120 to a proofmass 110, as shown in FIG. 1.

In shock events, the proofmass 110 hits over-range stops which define a maximum displacement deformation for the composite beam 120. When the proofmass 110 is disposed at an over-range stop, the flexlead 130 is bent/deformed more (such that the flexlead 130 is at high stress) so the rest of the composite beam 120, and specifically the insulator, will be at low stress. Cross section B-B shown in FIG. 3 illustrates an embodiment that exhibits a reduction in parasitic capacitance even in fixed portion 101 when a handle wafer portion is present beneath the insulator.

In one exemplary embodiment, the height of the composite beam 120 is between 5-12 μm. Additional insulator 126, 127 above or below the insulator 122 and the first conductor 121 may have a height of about 1 μm each. The insulator width might be fairly large, around 50 μm wide. The portions of the first conductor 121 on opposing sides of the insulator 122 may have a width of about 5 μm each. A piezoelectric material 124 that may be utilized in various embodiments is AlN or ScAlN as these materials have a low dielectric constant and require low parasitic capacitances. Maintaining symmetry left/right and up/down is desirable.

Method of Manufacture

FIGS. 4A-4E illustrate example steps for manufacturing a MEMS device in accordance with various embodiments of the present invention.

Figure 4A:
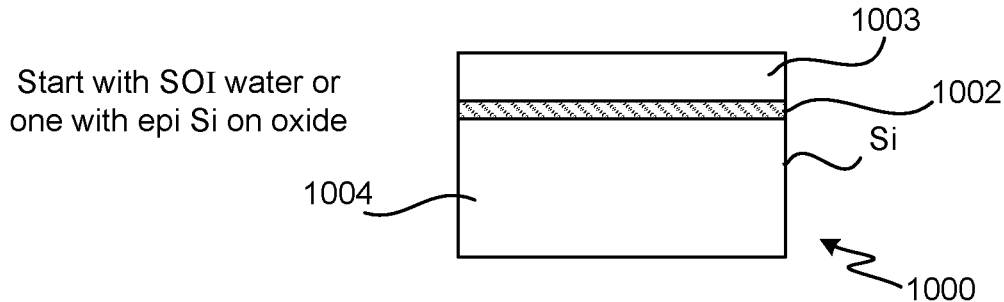
FIG. 4A-4E are example cross-sectional views of MEMS device manufacturing process steps according to one embodiment.

As shown in the cross-sectional view of FIG. 4A, the process begins with providing a silicon wafer 1000 having a box oxide layer 1002 disposed therein, between upper silicon layer 1003 and lower silicon layer 1004.

Figure 4B:
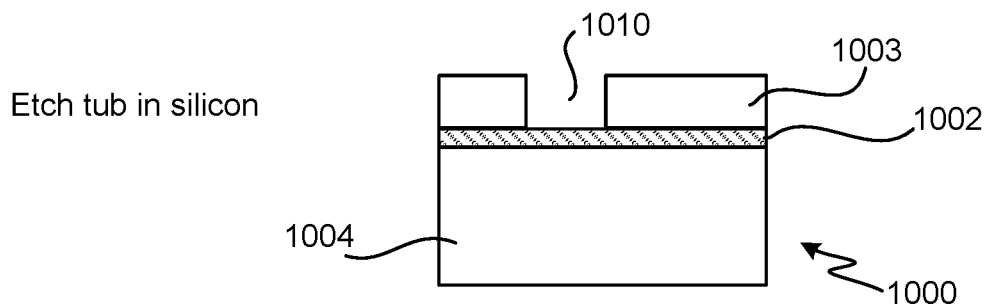

As shown in FIG. 4B, a tub 1010 is etched through the upper silicon layer 1003 to the oxide layer 1002. The etched tub 1010 may have a depth and shape corresponding to the shape of the insulator 122 to be included within the composite beam 120. Accordingly, in embodiments in which the MEMS device 100 includes at least two composite beams 120, a corresponding number of tubs 1010 may be etched therein.

Figure 4C:
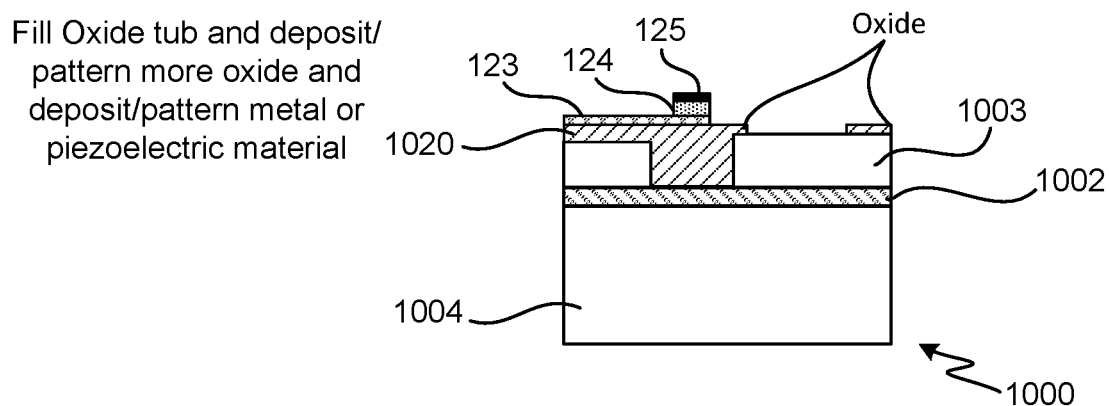

Each tub 1010 is filled with oxide 1020 to form insulating layer 122 of the composite beam 120. In certain embodiments, the oxide 1020 may extend over at least a portion of the top surface of the top silicon layer 1003 to form a top insulating layer as discussed herein. A metal conductor 123 is deposited/patterned onto the resulting top surface of the oxide 1020, and/or a piezoelectric material 124 is deposited onto the top surface of the oxide fill 1020 and/or the metal conductor 123, as shown in FIG. 4C. In certain embodiments, a top electrode 125 may be deposited onto the piezoelectric material 124.

Figure 4D:
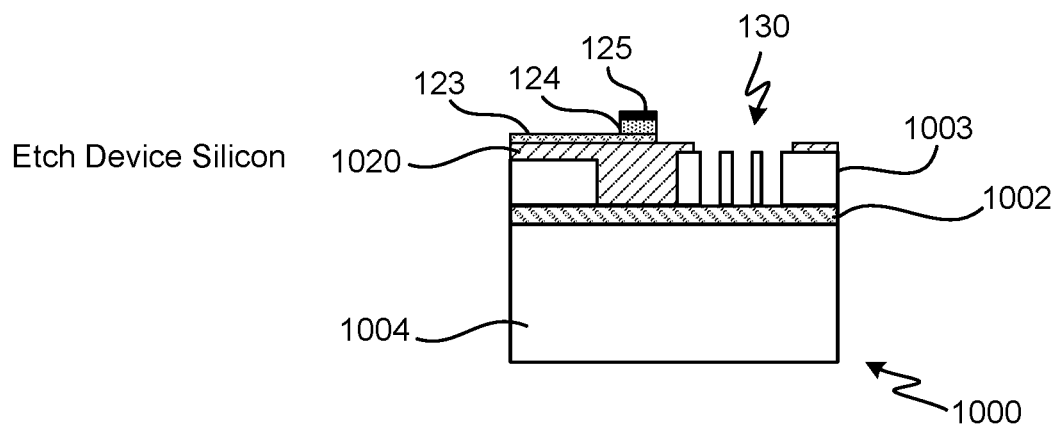

The top silicon layer 1003 is then etched to form the flexlead 130 between the proofmass 110 and what will become the composite beam 120, and to separate the side edges of the composite beam 120 (which are defined by the first conductor 121) from the proofmass 110 as shown in FIG. 4D. As discussed herein, such etching steps may comprise etching a plurality of apertures through the upper silicon layer 1003 (e.g., to define separate portions of the flexlead 130, to separate the composite beam 120 from the proofmass 110, and/or the like).

Figure 4E:
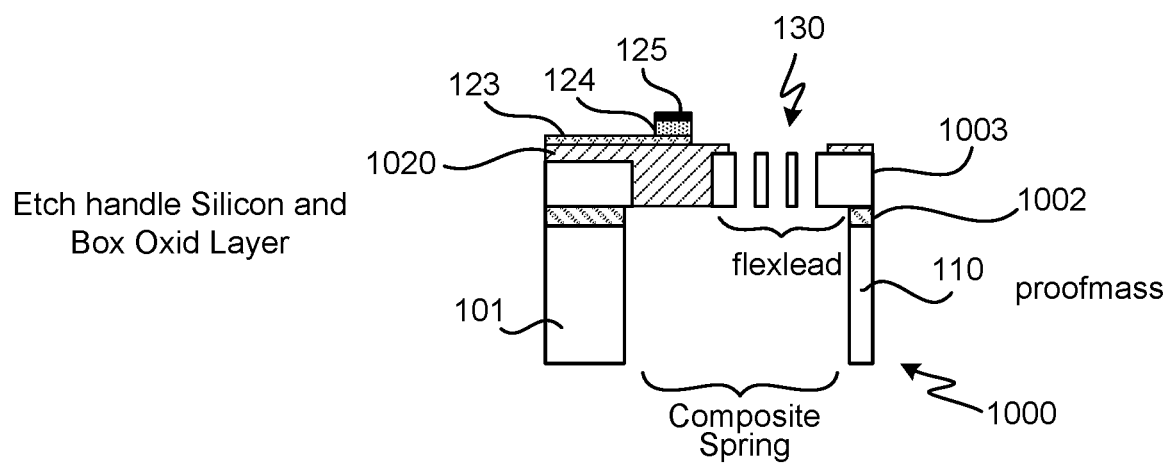

Finally, the lower silicon layer 1004 and the box oxide layer 1002 is etched to form the composite beam 120, as shown in FIG. 4E. In certain embodiments, the configuration may be turned 180° (such that the lower silicon layer 1004 is on top of the configuration within an etching system), such that the lower silicon layer 1004 may be etched using traditional etching techniques. By removing the lower silicon layer 1004 and then the box oxide layer 1002 below the composite beam 120, the resulting composite beam 120 has a thickness equivalent to the thickness of the top silicon layer 1003. As discussed herein, in certain embodiments the composite beam 120 may have a lower insulation layer 127, and in such embodiments the portion of the box oxide layer 1002 adjacent the composite beam 120 may not be etched, such that the box oxide layer 1002 defines the bottom insulating layer 127 of the composite beam 120. Moreover, the box oxide layer 1002 of such embodiments may be etched adjacent the flexlead 130, such that the resulting flexlead 130 is defined by silicon alone.

CONCLUSION

Many modifications and other embodiments will come to mind to one skilled in the art to which this disclosure pertains having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A micro-electromechanical system (MEMS) device comprising:
    a fixed portion;
    a first beam cantilevered relative to the fixed portion, wherein the first beam comprises:
        an insulator having a top surface and at least two side surfaces, wherein the insulator extends away from the fixed portion;
        a conductor extending away from the fixed portion and surrounding at least a portion of the insulator; and
        a second conductor positioned adjacent to the top surface of the conductor and extending parallel with the insulator away from the fixed portion.

2. The MEMS device of claim 1, wherein the insulator comprises oxide.

3. The MEMS device of claim 2, wherein the conductor comprises silicon.

4. The MEMS device of claim 3, wherein the second conductor comprises a metallic material.

5. The MEMS device of claim 1, further comprising a piezoelectric material disposed on a top surface of the second conductor.

6. The MEMS device of claim 5, wherein the piezoelectric material comprises at least one of: AlN or ScAlN.

7. The MEMS device of claim 1, further comprising at least one insulator cap positioned between the insulator and the second conductor.

8. The MEMS device of claim 1, wherein the conductor extends along a length of the first beam, adjacent the at least two side surfaces of the insulator.

9. The MEMS device of claim 8, wherein:
the insulator has a first height, measured parallel to the at least two side surfaces and perpendicular to the top surface;
the conductor has a second height, measured parallel to the first height, and wherein the second height is at least substantially equal to the first height.

10. The MEMS device of claim 9, wherein the first height is between about 5-12 μm.

11. The MEMS device of claim 10, wherein the insulator has a width, measured between two side surfaces of about 50 μm.

12. The MEMS device of claim 11, wherein the conductor has a thickness, measured parallel to the width of the insulator, of about 5 μm.

13. The MEMS device of claim 1, further comprising:
a proof mass suspended relative to the fixed portion; and
a first conducting flexlead extending from a distal end of the first beam, opposite the fixed portion, and connecting the proof mass with the first beam.

14. The MEMS device of claim 13, wherein the first conducting flexlead is integrally formed with the conductor.

15. The MEMS device of claim 14, wherein the first conducting flexlead and the conductor comprise silicon.

16. The MEMS device of claim 13, further comprising:
a second beam cantilevered relative to the fixed portion;
a second flexlead extending from a distal end of the second beam, opposite the fixed portion, and connecting the proof mass with the second beam.

\* \* \* \* \*